US010366953B2

(12) United States Patent
Chen et al.

(10) Patent No.: US 10,366,953 B2
(45) Date of Patent: Jul. 30, 2019

(54) REDISTRIBUTION LAYER STRUCTURES FOR INTEGRATED CIRCUIT PACKAGE

(71) Applicant: Taiwan Semiconductor Manufacturing Co., Ltd., Hsinchu (TW)

(72) Inventors: Jie Chen, New Taipei (TW); Chen-Hua Yu, Hsinchu (TW); Der-Chyang Yeh, Hsinchu (TW); Hsien-Wei Chen, Hsinchu (TW); Ying-Ju Chen, Yunlin County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/684,224

(22) Filed: Aug. 23, 2017

(65) Prior Publication Data

US 2018/0158777 A1 Jun. 7, 2018

Related U.S. Application Data

(60) Provisional application No. 62/430,223, filed on Dec. 5, 2016.

(51) Int. Cl.
*H01L 23/528* (2006.01)
*H01L 23/00* (2006.01)
(Continued)

(52) U.S. Cl.
CPC ...... *H01L 23/5283* (2013.01); *H01L 23/5226* (2013.01); *H01L 24/02* (2013.01); *H01L 24/16* (2013.01); *H01L 24/19* (2013.01); *H01L 24/20* (2013.01); *H01L 24/24* (2013.01); *H01L 24/25* (2013.01); *H01L 24/96* (2013.01); *H01L 25/105* (2013.01); *H01L 25/50* (2013.01); *H01L 24/73* (2013.01); *H01L 24/92* (2013.01); *H01L 24/97* (2013.01); *H01L 25/0657* (2013.01); *H01L 2224/0233* (2013.01);
(Continued)

(58) Field of Classification Search
None
See application file for complete search history.

(56) References Cited

U.S. PATENT DOCUMENTS 8,656,333 B1 * 2/2014 Bishop .............. H01L 23/49838
257/737
8,759,964 B2 * 6/2014 Pu .......................... H01L 21/561
257/690

(Continued)

*Primary Examiner* — Andres Munoz
(74) *Attorney, Agent, or Firm* — Sterne, Kessler, Goldstein & Fox P.L.L.C.

(57) ABSTRACT

An integrated circuit (IC) package with improved performance and reliability is disclosed. The IC package includes an IC die and a routing structure. The IC die includes a conductive via having a peripheral edge. The routing structure includes a conductive structure coupled to the conductive via. The conductive structure may include a cap region, a routing region, and an intermediate region. The cap region may overlap an area of the conductive via. The routing region may have a first width and the intermediate region may have a second width along the peripheral edge of the conductive via, where the second width may be greater than the first width. The intermediate region may be arranged to connect the cap region to the routing region.

20 Claims, 8 Drawing Sheets

(51) Int. Cl.
*H01L 25/10* (2006.01)
*H01L 23/522* (2006.01)
*H01L 25/00* (2006.01)
*H01L 25/065* (2006.01)

(52) U.S. Cl.
CPC ............... *H01L 2224/02373* (2013.01); *H01L 2224/02375* (2013.01); *H01L 2224/02379* (2013.01); *H01L 2224/02381* (2013.01); *H01L 2224/04105* (2013.01); *H01L 2224/12105* (2013.01); *H01L 2224/16235* (2013.01); *H01L 2224/24147* (2013.01); *H01L 2224/25171* (2013.01); *H01L 2224/32145* (2013.01); *H01L 2224/32225* (2013.01); *H01L 2224/48091* (2013.01); *H01L 2224/48227* (2013.01); *H01L 2224/73209* (2013.01); *H01L 2224/73265* (2013.01); *H01L 2224/73267* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/00014* (2013.01); *H01L 2924/15311* (2013.01); *H01L 2924/181* (2013.01); *H01L 2924/3512* (2013.01)

(56) References Cited

U.S. PATENT DOCUMENTS

| | | | | |
|---|---|---|---|---|
| 9,040,316 | B1* | 5/2015 | Scanlan | H01L 21/76879 438/15 |
| 2008/0132065 | A1* | 6/2008 | Allman | H01L 21/76838 438/667 |
| 2009/0309212 | A1* | 12/2009 | Shim | H01L 21/568 257/700 |
| 2011/0074041 | A1* | 3/2011 | Leung | H01L 23/498 257/774 |
| 2011/0198753 | A1* | 8/2011 | Holland | H01L 23/3114 257/738 |
| 2014/0110856 | A1* | 4/2014 | Lin | H01L 24/19 257/774 |
| 2014/0252611 | A1* | 9/2014 | Chen | H01L 23/49816 257/738 |
| 2014/0262468 | A1* | 9/2014 | Chen | H01L 23/53295 174/262 |
| 2014/0264884 | A1* | 9/2014 | Chen | H01L 21/76802 257/762 |
| 2015/0043190 | A1* | 2/2015 | Mohammed | H01L 21/4846 361/820 |
| 2015/0262909 | A1* | 9/2015 | Chen | H01L 21/76804 257/774 |
| 2016/0211212 | A1* | 7/2016 | Chao | H01L 23/5226 |

* cited by examiner

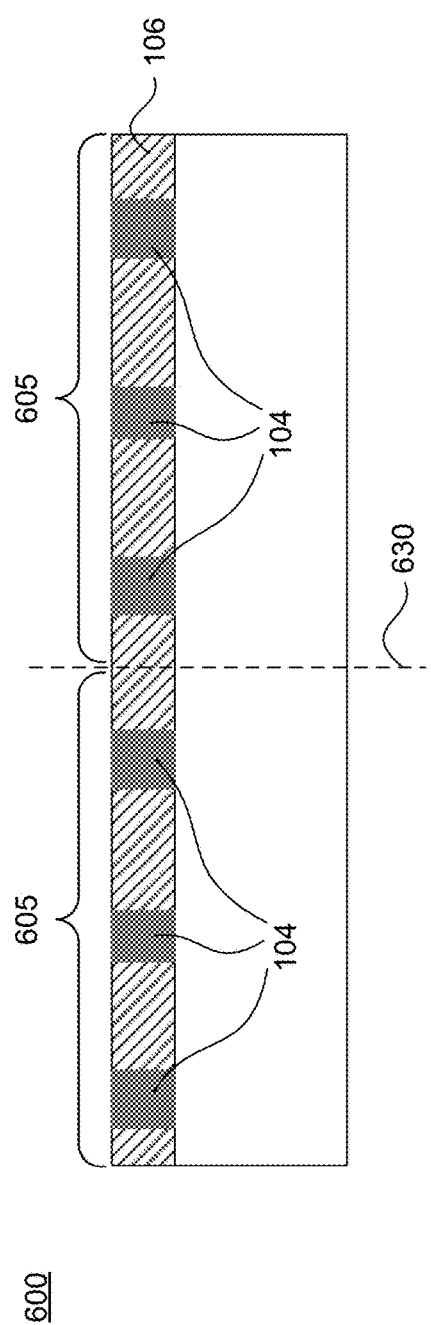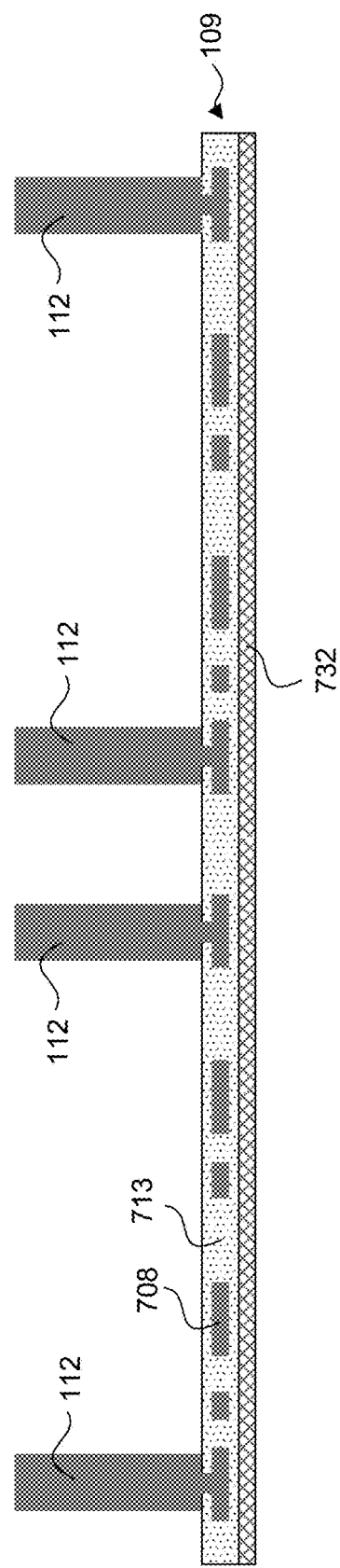

US 10,366,953 B2

REDISTRIBUTION LAYER STRUCTURES FOR INTEGRATED CIRCUIT PACKAGE

CROSS-REFERENCE TO RELATED APPLICATION

This application claims priority to U.S. Provisional Patent Application No. 62/430,223, filed on Dec. 5, 2016, titled "Redistribution Layer Structures for Integrated Circuit Package," which is incorporated herein by reference in its entirety.

BACKGROUND

This disclosure generally relates to packaging of integrated circuits (ICs).

With advances in IC technology, there has been increasing demand for higher storage capacity, faster processing systems, and higher performance components in ICs. To meet these demands, the IC industry continues to scale down the dimensions of IC components such as semiconductor devices (e.g., metal oxide semiconductor field effect transistors (MOSFETs), including planar MOSFETs and finFETs). Such scaling has also increased the demand for smaller and reliable packaging of semiconductor dies.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 6-11 are cross-sectional views of an integrated circuit package at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
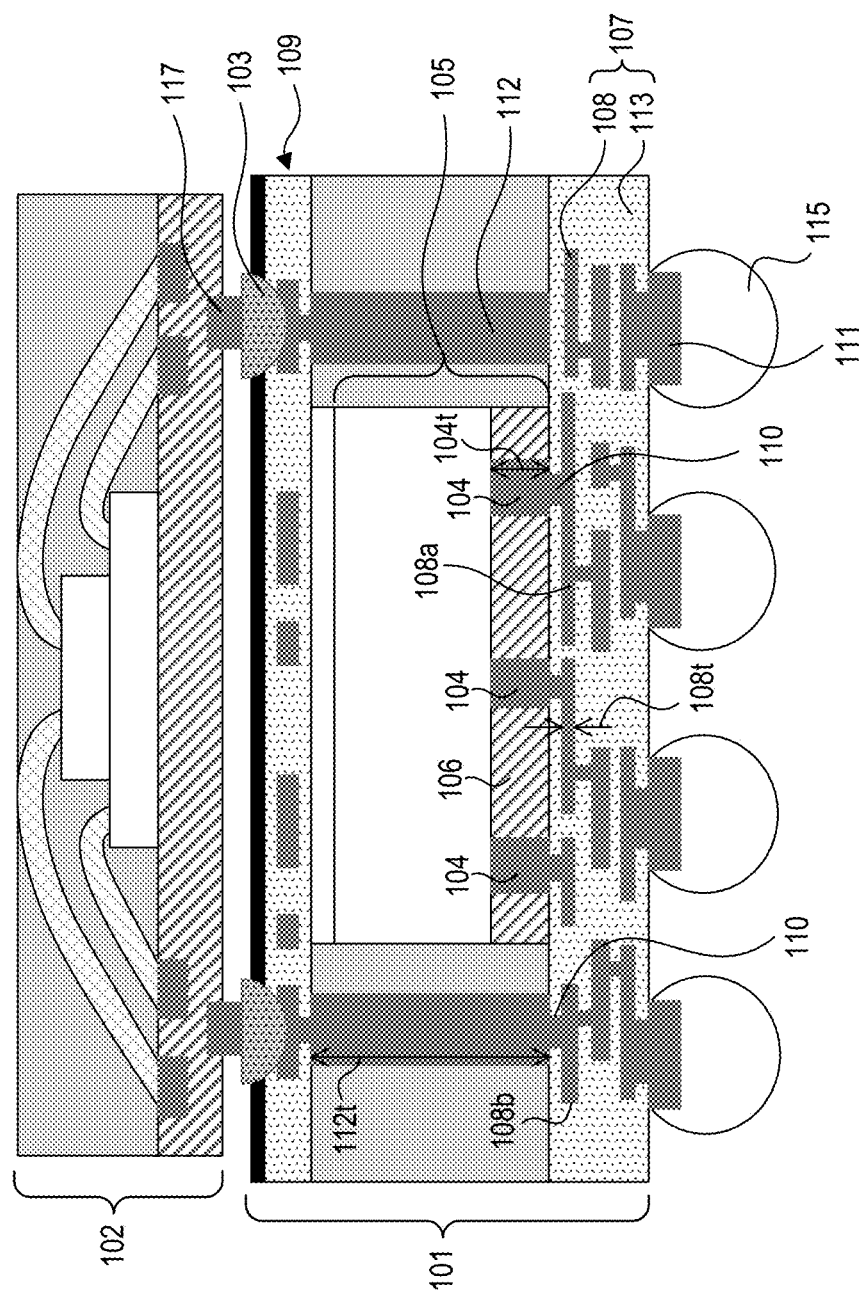
FIG. 1 is a side cross-sectional view of an integrated circuit package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "about" as used herein indicates the value of a given quantity varies by ±10% of the value, unless noted otherwise.

As used herein, the term "substrate" describes a material onto which subsequent material layers are added. The substrate itself may be patterned. Materials added on top of the substrate may be patterned or may remain unpatterned. Furthermore, the substrate may be any of a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (i.e., greater than 3.9).

This disclosure provides various redistribution layer (RDL) structures for an integrated circuit (IC) package for improving the reliability of the IC package, according to some embodiments. For example, various RDL structures are described herein for substantially reducing and/or preventing formation of stress induced cracks in RDL structures in IC packages and consequently improving the performance and reliability of the IC packages.

FIG. 1 is a cross-sectional view of an integrated circuit (IC) package 100, according to some embodiments. IC package 100 may include a first IC package 101 and a second IC package 102. In some embodiments, IC package 100 may be a package-on-package (PoP) package, where second IC package 102 is stacked on top of first IC package 101. In some embodiments, first and second IC packages 101 and 102 may be similar to or different from each other. In some embodiments, first IC package 101 may include a system-on-chip (SoC) package and second IC package 102 may include a dynamic random access memory (DRAM) IC package. First and second IC packages 101 and 102 may be mechanically and electrically coupled to each other through inter-package connectors 103. In some embodiments, inter-package connectors 103 may include solder regions.

According to some embodiments, first IC package 101 may include IC die 105, conductive through-vias 112, frontside routing structure 107, backside routing structure 109, contact pads 111, and conductive connectors 115. In some embodiments, inter-package connectors 103 may be coupled to back side routing structure 109 and contact pads 117 of second IC package 102. Frontside routing structure 107 may be coupled to conductive connectors 115 through contact pads 111. Conductive connectors 115 may be used to electrically connect first IC package 101, for example, to a printed circuit board (PCB). In some embodiments, conductive connectors 115 may include solder balls or suitable IC package mounts.

In some embodiments, frontside routing structure 107 may include redistribution layer (RDL) structures 108 in an insulating layer 113. In some embodiments, insulating layer 113 may include a stack of insulating layers and each row of RDL structures 108 may be in each layer of the stack of insulating layers. Even though FIG. 1 shows three rows of RDL structures 108, frontside routing structure 107 may include one or more rows of RDL structures 108.

In some embodiments, RDL structures 108 may be electrically coupled to conductive vias 104 of IC die 105 112 through conductive vias 110 of frontside routing structure 107. In some embodiments, RDL structures 108 may be electrically coupled to conductive through-vias 112 through conductive vias 110 of frontside routing structure 107. RDL structures 108 may be configured to fan out IC die 105 such that I/O connections (not shown) on IC die 105 can be redistributed to a greater area than IC die 105, and hence the number of I/O connections of IC die 105 can be increased. In some embodiments, one or more of RDL structures 108 in a row closest to conductive vias 104 (e.g., RDL structure 108a) and conductive through-vias 112 (e.g., RDL structure 108b) may have a thickness 108t in a range from about 1.5 µm to about 8 µm. In some embodiments, RDL structures 108 in each row may have a thickness similar to or different from each other. RDL structures 108 may be conductive structures and may include conductive material such as metal (e.g., copper or aluminum), metal alloys (e.g., copper alloys or aluminum alloys), or a combination thereof, according to some embodiments. Based on the disclosure herein, it will be recognized that other thicknesses and materials for RDL structures 108 are within the scope and spirit of this disclosure.

Conductive vias 104 may be electrically coupled to interconnect structures (not shown) of IC die 105 that may be formed in the front end of the line (FEOL) stage of IC fabrication, according to some embodiments. Conductive vias 104 may include: (i) a metal such as, but not limited to, copper, aluminum, tungsten, titanium, tantalum, titanium nitride, tantalum nitride, titanium aluminum, titanium aluminum nitride, tungsten nitride; (ii) a metal alloy such as, but not limited to, copper alloys, aluminum alloys; or (iii) a combination thereof. In some embodiments, conductive vias 104 may have a thickness 104t in a range from about 5 µm to about 30 µm. Based on the disclosure herein, it will be recognized that other materials and thicknesses for conductive vias 104 are within the scope and spirit of this disclosure. In some embodiments, conductive vias 104 may be electrically isolated from each other by an insulating layer 106, which may include a polymer such as, for example, polybenzoxazole (PBO), benzocyclobutene (BCB), or a suitable polymer. Based on the disclosure herein, it will be recognized that other insulating materials for insulating layer 106 are within the scope and spirit of this disclosure.

Conductive through-vias 112 may have a thickness 112t in a range from about 35 µm to about 750 µm, according to some embodiments. Through-vias 112 may be configured to provide electrical connection, for example, between first IC package 101 and second IC package 102 and/or between IC die 105 and other IC dies (not shown) of first IC package 101. In some embodiments, the electrical connection may be provided by through-vias 112 through frontside and backside routing structures 107 and 109. According to some embodiments, through-vias 112 may include metal (e.g., copper or aluminum), metal alloys (e.g., copper alloys or aluminum alloys), or a combination thereof. Based on the disclosure herein, it will be recognized that other materials for through-via 112 are within the scope and spirit of this disclosure.

RDL structures 108a and 108b of FIG. 1 are further described with reference to FIGS. 2 and 3, which illustrate example top views of RDL structures 108a and/or 108b.

Figure 2:
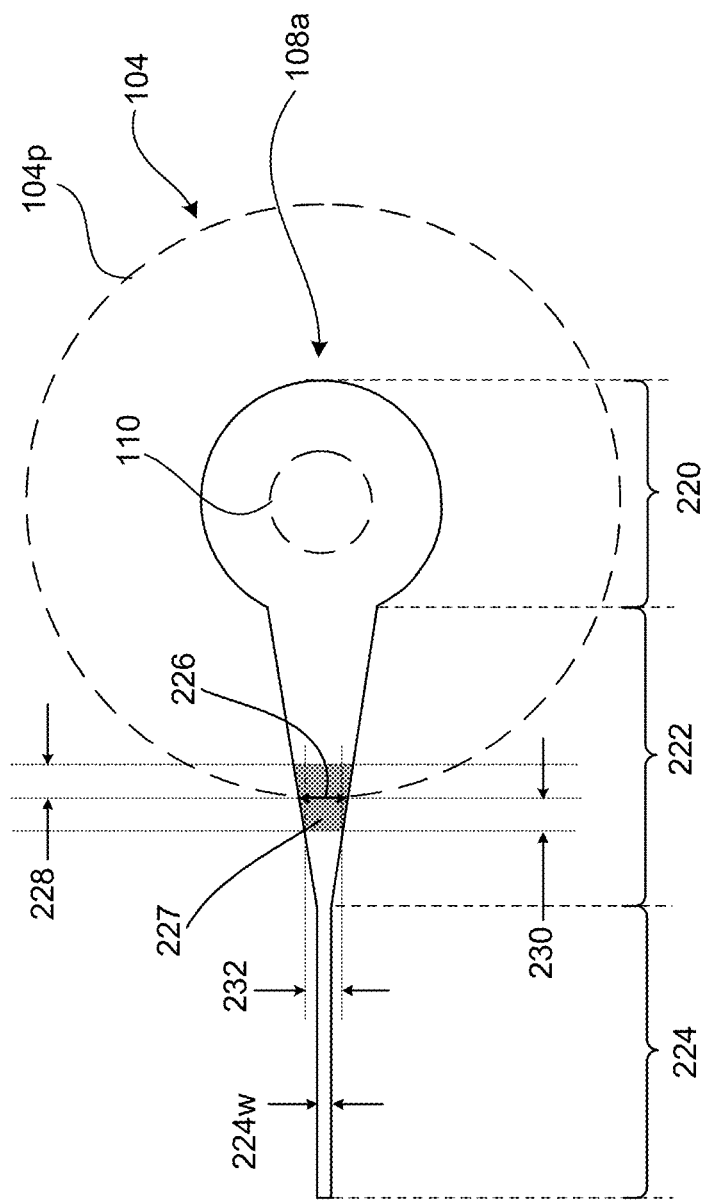
FIGS. 2 and 3 are top views of various redistribution layer structures of an integrated circuit package, in accordance with some embodiments.

According to some embodiments, FIG. 2 illustrates an example top view of RDL structure 108a overlying conductive via 104 of IC die 105. In some embodiments, RDL structure 108b overlying conductive through-via 112 may have a similar top view as shown in FIG. 2. For the sake of clarity, top view of structures and/or layers underlying RDL structure 108a is not shown in FIG. 2 except for a top view of conductive vias 104 and 110. It will be recognized that elements of FIGS. 1 and 2—e.g., RDL structure 108a, conductive vias 104 and 110—are shown for illustration purposes and may not be drawn to scale.

In some embodiments, RDL structure 108a may include a cap region 220, a routing region 224, and an intermediate region 222 arranged to connect cap region 220 to routing region 224. Cap region 220 may overlap conductive vias 104 and 110 and may be in contact with conductive via 104 through conductive via 110. In some embodiments, cap region 220 may have a circular shape in top view and may have a diameter in a range from about 50 µm to about 200 µm. Routing region 224 may not overlap conductive via 104 and may have a width 224w that is less than 10 µm, according to some embodiments. In some embodiments, width 224w may be in a range from about 1 µm to about 9 µm. Based on the disclosure herein, it will be recognized that other dimensions for cap region 220 and routing region 224 are within the scope and spirit of this disclosure.

According to some embodiments, intermediate region 222 may be a tapered region (also referred to herein as "a bird's beak"). A first portion of intermediate region 222 may overlap with an area of conductive via 104 and a second portion of intermediate region 222 may not overlap with conductive via 104. Portion of intermediate region 222 overlying a peripheral edge 104p of conductive via 104 may have a width 226 greater than width 224w and/or smaller than diameter of cap region 220. Width 226 may be along peripheral edge 104p. In some embodiments, width 226 may be greater than 10 µm. In some embodiments, width 226 may be in a range from about 10 µm to about 70 µm. Based on the disclosure herein, it will be recognized that other dimensions for width 226 are within the scope and spirit of this disclosure.

In some embodiments, intermediate region 222 may have a region 227 that partially extends along a predetermined distance 228 inside peripheral edge 104p of conductive via 104 and partially extends along a predetermined distance 230 outside peripheral edge 104p of conductive via 104. Each of predetermined distances 228 and 230 may be in a range from about 8 μm to about 12 μm. Predetermined distances 228 and 230 may be equal to or different from each other. Region 227 of intermediate region 222 may have a length equal to sum of predetermined distances 228 and 230 and may have a width 232 greater than width 224w of routing region 224w and/or smaller than diameter of cap region 220. Based on the disclosure herein, it will be recognized that other dimensions for region 227 are within the scope and spirit of this disclosure.

Figures 3, 4:
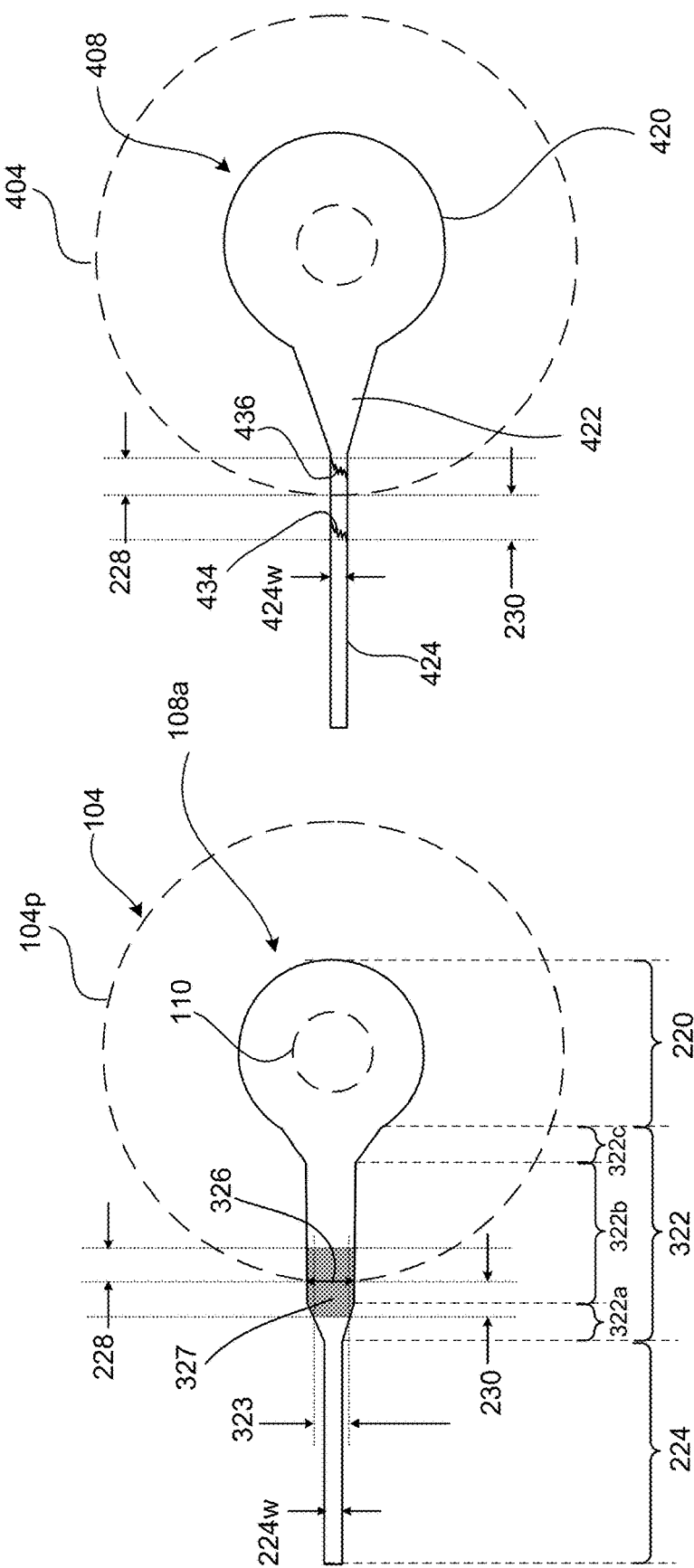
FIG. 4 is a top view of an example redistribution layer structure of an integrated circuit package.

FIG. 3 illustrates another example top view of RDL structure 108a, according to some embodiments. Elements in FIG. 3 with the same annotations as elements in FIG. 2 are described above. The remaining elements in FIG. 3 are described below.

According to some embodiments, with respect to FIG. 3, RDL structure 108a may include cap region 220, routing region 224, and an intermediate region 322 arranged to connect cap region 220 to routing region 224. Intermediate region 322 may include first and second tapered regions 322a and 322c, respectively, and a non-tapered region 322b (e.g., a rectangular region). First tapered region 322a may not overlap with conductive via 104, while second tapered region 322c may overlap with an area of conductive via 104. Non-tapered region 322b may partially overlap an area of conductive via 104 and may partially overlap with conductive via 104. Portion of non-tapered region 322b overlying peripheral edge 104p of conductive via 104 may have a width 326 greater than width 224w and/or smaller than diameter of cap region 220. Width 326 may be along peripheral edge 104p. In some embodiments, width 326 may be greater than 10 μm. In some embodiments, width 326 may be in a range from about 10 μm to about 70 μm. Based on the disclosure herein, it will be recognized that other dimensions for width 326 are within the scope and spirit of this disclosure.

In some embodiments, a region 327 of intermediate region 322 partially extends along predetermined distance 228 inside peripheral edge 104p of conductive via 104 and partially extends along predetermined distance 230 outside peripheral edge 104p of conductive via 104. Region 327 may have a length equal to sum of predetermined distances 228 and 230 and may have a width 332 greater than width 224w of routing region 224w and/or smaller than diameter of cap region 220. Based on the disclosure herein, it will be recognized that other dimensions for region 327 are within the scope and spirit of this disclosure.

Each of cap region 220, conductive vias 104 and 110 may have a geometric shape other than the circular shapes shown in FIGS. 2 and 3, according to some embodiments. For example, cap region 220, conductive vias 104, and/or 110 may have a rectangular shape, an elliptical shape, or any combination thereof. The geometric shape of cap region 220, conductive vias 104 and 110 in top view may be different from each other, according to some embodiments. Based on the disclosure herein, it will be recognized that these other geometric shapes are within the scope and spirit of this disclosure.

Shapes and dimensions of intermediate regions 222 and/or 322 described above with reference to FIGS. 2 and 3 may help to improve structural reliability of RDL structures compared to other RDL structures in IC packages. For example, RDL structures having intermediate region width 226 or 326 greater than routing region width 224w along peripheral edge 104p of conductive via 104, as described above, may help prevent formation of stress induced cracks observed in other RDL structures. Similarly, RDL structures having region 227 or 327 with its width greater than routing region width 224w, as described above, may also help to prevent such cracks.

FIG. 4 illustrates a top view of an example of one of the other RDL structures 408. RDL structure 408 may have a cap region 420, an intermediate region 422, and a routing region 424 having a width 424w (e.g., less than 10 μm). In contrast to the disclosure above with respect to FIGS. 2 and 3, routing region 424 of RDL structure 408 partially overlaps an area of conductive via 404 within predetermined distance 228 from peripheral edge of conductive via 404. Routing region 424 also overlaps an area external to conductive via 404 within predetermined distance 230 from peripheral edge of conductive via 404. Conductive via 404 may be similar to conductive via 104 and predetermined distances 228 and 230 are similar to those described in FIGS. 2 and 3.

Routing region width 424w can be, for example, less than 10 μm. As a result, the widths of RDL structure 408 within predetermined distances 228 and 230 are smaller than 10 μm, which is in contrast to the embodiments described above. Reliability tests of IC packages having RDL structures such as RDL structure 408 and failure analysis of failed devices in these reliability test have shown that RDL structures having dimensions smaller than 10 μm within predetermined distances 228 and 230 are susceptible to formation of stress induced cracks such as cracks 434 and 436 shown in FIG. 4. Stress in RDL structures may be induced, for example, from exposure of IC packages to moisture, pressure, or temperature during their operation. This stress can be minimized or removed—thus preventing stress induced cracks 434 and 436—by forming RDL structures consistent with this disclosure—e.g., RDL structure 108a in FIGS. 1-3.

Figure 5:
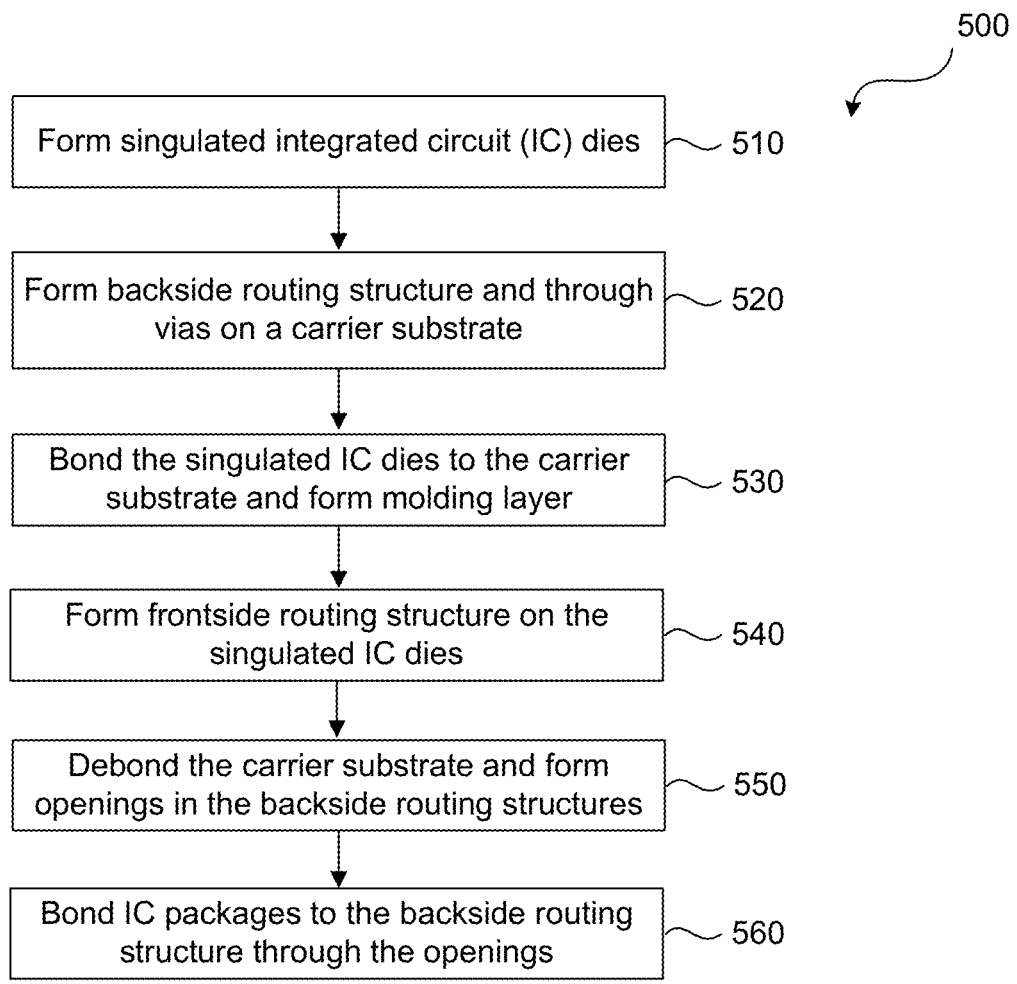
FIG. 5 is flow diagram of a method for fabricating an integrated circuit package, in accordance with some embodiments.

FIG. 5 is a flow diagram of an example method 500 for fabricating an IC package 100, shown in FIG. 1, according to some embodiments. Operations can be performed in a different order or not performed depending on specific applications. It should be noted that additional processes may be provided before, during, and/or after method 500, and that some of the processes are briefly described herein.

For illustrative purposes, the operations illustrated in FIG. 5 will be described with reference to the example fabrication process illustrated in FIGS. 6-11. FIGS. 6-11 are cross-sectional views of IC package 100 at various stages of its fabrication, according to some embodiments. It will be recognized that the views in FIGS. 6-11 are shown for illustration purposes and may not be drawn to scale. Elements in FIGS. 6-11 with the same annotations as elements in FIGS. 1-3 are described above.

In operation 510, singulated IC dies are formed from a semiconductor wafer having a plurality of IC dies. For example, as shown in FIG. 6, a semiconductor wafer 600 having a plurality of IC dies 605 may be diced along dashed line 630 to form singulated IC dies 605. In some embodiments, each of singulated IC dies 605 may be similar to IC die 105 discussed above. In some embodiments, the dicing process may be performed, for example, by scribing, sawing, or other suitable dicing technique.

In operation 520, backside routing structure and conductive through-vias are formed on a carrier substrate. For example, as shown in FIG. 7, backside routing structure 109 and conductive through-vias 112 are formed on a carrier substrate 732. In some embodiments, carrier substrate 732 may include materials, such as, for example, glass, silicon oxide, aluminum oxide, or a semiconductor wafer. Based on the disclosure herein, it will be recognized that other materials for carrier substrate 732 are within the scope and spirit of this disclosure.

In some embodiments, backside routing structure 109 may include an insulating layer 713 formed on carrier substrate 732. Insulating layer 713 may include a polymer, such as, for example, polyimide (PI), polybenzoxazole (PBO), a low dielectric constant (low-K) dielectric material, such as, for example, phosphosilicate glass (PSG), borophosphosilicate glass (BPSG), fluorinated silicate glass (FSG), $SiO_xC_y$, spin-on-glass, silicon carbon material, a suitable insulating material, or a combination thereof. In some embodiments, insulating layer 713 may have thickness ranging from about 1 μm to about 20 μm. In some embodiments, insulating layer 713 may be formed by spin coating, chemical vapor deposition (CVD), plasma-enhanced CVD (PECVD), or a suitable deposition method for insulating materials. Based on the disclosure herein, it will be recognized that other materials, thicknesses, and deposition process for insulating layer 713 are within the scope and spirit of this disclosure.

In some embodiments, redistribution layer (RDL) structures 708 may be formed within insulating layer 713, for example, using subtractive and/or damascene techniques. In some embodiments, formation of RDL structures 708 may include a sputtering process, a photolithography process, a plating process, or a combination thereof. In some embodiments, RDL structures 708 may be similar to RDL structures 108 discussed above.

In some embodiments, the formation of conductive through-vias 112 may include a deposition of a seed layer (not shown) on backside routing structure 109, for example, using CVD, physical vapor deposition (PVD), or a suitable deposition method. The seed layer may include a seed material for a subsequent plating process for formation of conductive through-vias 112. The seed layer may include (i) a metal, such as, for example, copper, titanium; (ii) metal alloy; or (iii) a combination thereof. The seed layer may have a thickness ranging from about 50 nm to about 500 nm.

The deposition of the seed layer may be followed by a deposition of a sacrificial material (not shown), such as, for example, photoresists over the seed layer. The deposition of the sacrificial material may be followed by patterning of it with a desired pattern for a plurality of through-vias 112 using, for example, a photolithography process. The patterning process may be followed by a plating process to form conductive through-vias 112 over the seed layer. The plating process may include an electro-chemical plating (ECP) or a suitable plating processes, according to some embodiments. The seed layer may function as a seed for the plating process for the conductive material in conductive through-vias 112. The conductive material may be plated over the seed layer through the patterned sacrificial material. The formation of conductive through-vias 112 may be followed by removal of the sacrificial material and unused portions of the seed layer.

In some embodiments, conductive through-vias 112 may be formed, for example, using subtractive techniques or damascene techniques, instead of the seeding and plating process. For example, in a subtractive technique, a conductive material may be formed over the entire surface of backside routing structure 109, and the conductive material may be patterned, for example, using photolithography to form conductive through-vias 112.

Figure 8:
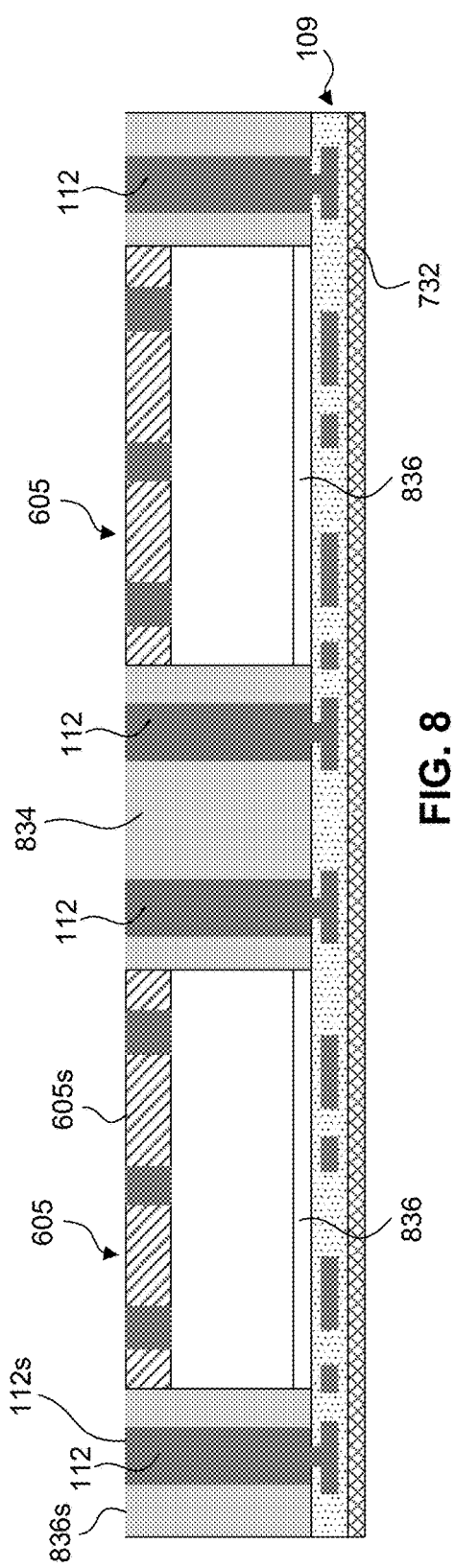

Referring back to FIG. 5, in operation 530, the singulated IC dies are bonded to the carrier substrate and a molding layer is formed. For example, as shown in FIG. 8, singulated IC dies 605 are bonded to the structure of FIG. 7 and a molding layer 834 is formed to fill the gaps between singulated IC dies and conductive through-vias 112. FIG. 8 shows two singulated IC dies 605, but it will be understood that one or more singulated IC dies may be bonded on carrier substrate 732.

In some embodiments, singulated IC dies 605 may be bonded to backside routing structure 109 using an adhesive layer 836, such as, for example, a die attach film (DAF). In some embodiments, singulated IC dies 605 may be bonded to backside routing structure 109 manually or using an automated machine such as a pick-and-place machine.

The placement and bonding of singulated IC dies 605 on backside routing structure 109 may be followed by formation of molding layer 836. Molding layer 836 may be configured to encapsulate singulated IC dies 605 and conductive through-vias 112 as shown in FIG. 8.

In some embodiments, molding layer 836 may include an insulating material, such as, for example, an epoxy, an organic polymer, a polymer with or without a silica-based or glass filler added, a suitable insulating or encapsulating material, or a combination thereof. In some embodiments, molding layer 836 may include a liquid molding compound (LMC) that is a gel type liquid when applied. The molding material may be applied while in liquid form and subsequently treated to solidify the molding material.

In some embodiments, the molding material of molding layer 836 may be formed within the gaps between singulated IC dies and conductive through-vias 112 using, for example, a wafer level molding process. The molding material of molding layer 836 may be molded using, for example, compressive molding, transfer molding, or a suitable molding process.

The deposition of molding material for the formation of molding layer 836 may be followed by a curing process, according to some embodiments. The curing process may include heating the molding material to a predetermined temperature for a predetermined period of time using an anneal process. The curing process may further include an ultra-violet (UV) light exposure process and/or an infrared (IR) energy exposure process, or a combination with a heating process. Alternatively, the curing process may not be included in the formation of molding layer 836.

Figure 9:
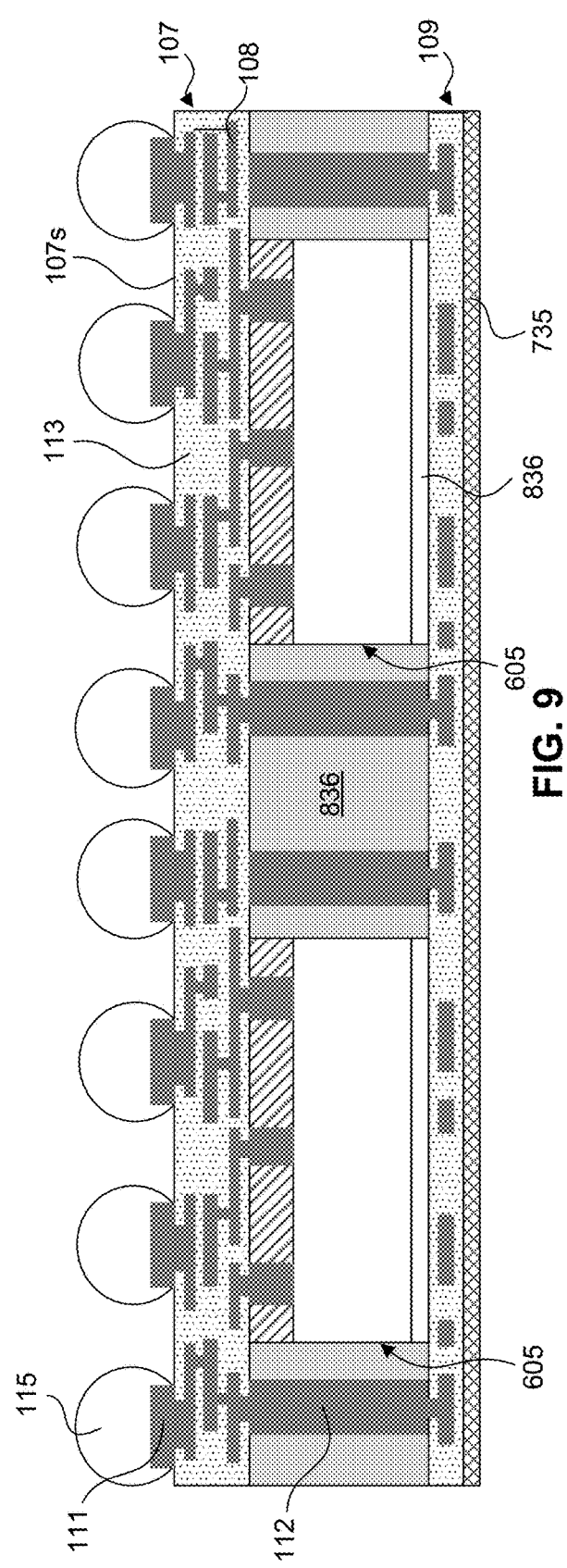

Formation of molding layer 836 further includes removal of a portion of the deposited and/or cured molding material from top surfaces 112s and 605s of respective conductive through-vias 112 and singulated IC dies 605. The portion of the molding material may be removed using, for example, a grinding process or a chemical-mechanical polishing (CMP) process. In some embodiments, the removal of the portion of the molding material may include a combination of a grinding process and a CMP process may be used. The CMP process and/or grinding process may be adapted to stop when top surfaces 112s, 605s, and 836s of respective conductive through-vias 112, singulated IC dies 605, and molding layer 836 are substantially coplanar. The top surface 836s of molding layer being substantially coplanar with top surfaces 112s and 605s may advantageously facilitate in the formation of subsequently formed RDL structures 108, as shown in FIG. 9.

Referring back to FIG. 2, in operation 540, a frontside routing structure is formed on the singulated IC dies and the conductive through-vias. For example, as shown in FIG. 9, frontside routing structure 107 may be formed on singulated IC dies 605 and conductive through-vias 112. The formation of frontside routing structure 107 may include formation of RDL structures 108 in insulating layer 113, as shown in FIG. 9.

In some embodiments, each row of RDL structures 108 may be formed within a layer of insulating layer 113, which may include a plurality of layers. In some embodiments, insulating layer 113 may include a low dielectric constant (low-K) dielectric material, such as phosphosilicate glass (PSG), borophosphosilicate glass (BPSG), fluorinated silicate glass (FSG), SiOxCy, spin-on-glass, spin-on-polymers, silicon carbon material, or a combination thereof. In some embodiments, insulating layer 113 may be deposited using, for example, a spincoating process, CVD, and/or PECVD.

In some embodiments, RDL structures 108 may include a metal, a metal alloy, or a suitable conductive material. Each row of RDL structures 108 may be formed using, for example, subtractive and/or damascene techniques. The subtractive and/or damascene processes may include a sputtering process, a photolithography process, a plating process, or a combination thereof, according to some embodiments.

The formation of frontside routing structure 107 may be followed by formation of contact pads 111 and conductive connectors 115. Contact pads 111 may be formed on top surface 107s of frontside routing structure 107. In some embodiments, contact pads 111 include under-ball metallization (UBM) structures for the subsequently formed conductive connectors 115, which may include solder balls.

The formation of contact pads 111 may be followed by the formation of conductive connectors 115, which are each electrically coupled to respective one of contact pads 111. Conductive connectors 115 may coupled to contact pads using, for example, a ball mount process. In some embodiments, conductive connectors 115 may include a eutectic material such as, for example, solder balls or solder paste that is reflowed by heating the eutectic material to a melting temperature of the eutectic material. The eutectic material may then be allowed to cool and re-solidify, forming conductive connectors 115. In some embodiments, conductive connectors 146 may include other types of electrical connectors, such as, for example, microbumps, controlled collapse chip connection (C4) bumps, or pillars, and may include conductive materials such as Cu, Sn, Ag, Pb, or the like.

In some embodiments, the formation of conductive connectors 115 may be followed by the formation of an insulating layer (not shown) between conductive connectors 115 over frontside routing structure 107.

Figure 10:
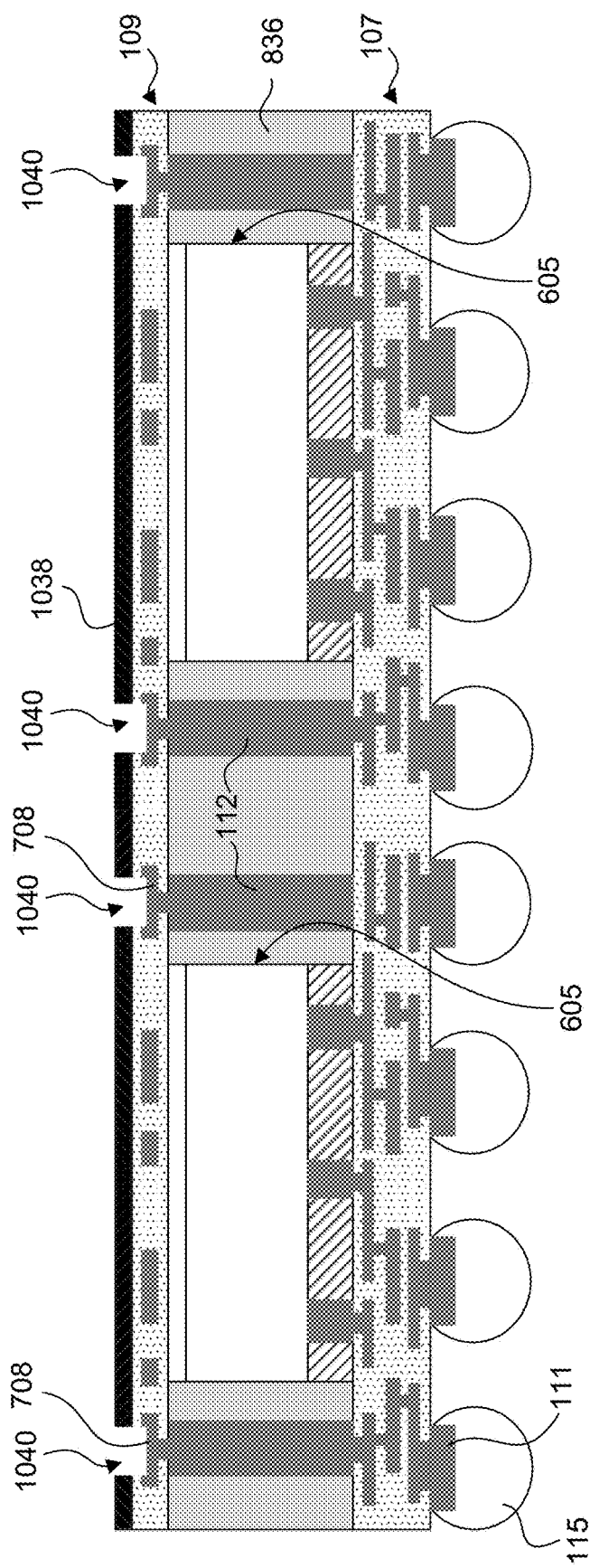

Referring back to FIG. 5, in operation 550, the carrier substrate is removed and openings are formed in the backside routing structure. For example, as shown in FIG. 10, carrier substrate 732 may be removed and openings 1040 may be formed in backside routing structure 109.

In some embodiments, removing carrier substrate 732 may include inverting the structure of FIG. 9, coupling the structure on the side having conductive connectors 115 to a dicing tape (not shown), and using a de-bonding process. In some embodiments, the debonding process may be followed by a deposition of a protective film 1038 on backside routing structure 109, as shown in FIG. 10. Protective film 1038 may include a lamination film (e.g., lamination coating tape or DAF) formed using, for example, a lamination process, according to some embodiments. In some embodiments, protective film 1038 may have a thickness ranging from about 1 μm to about 100 μm.

The formation of protective film 1038 may be followed by formation of openings 1040, which may include patterning (e.g., photolithography) and etching. In some embodiments, laser drilling may be used to form openings 1040. As shown in FIG. 10, openings 1040 may be formed to expose RDL structures 708 in backside routing structure 109 that are directly coupled to conductive through-vias 112.

Figure 11:
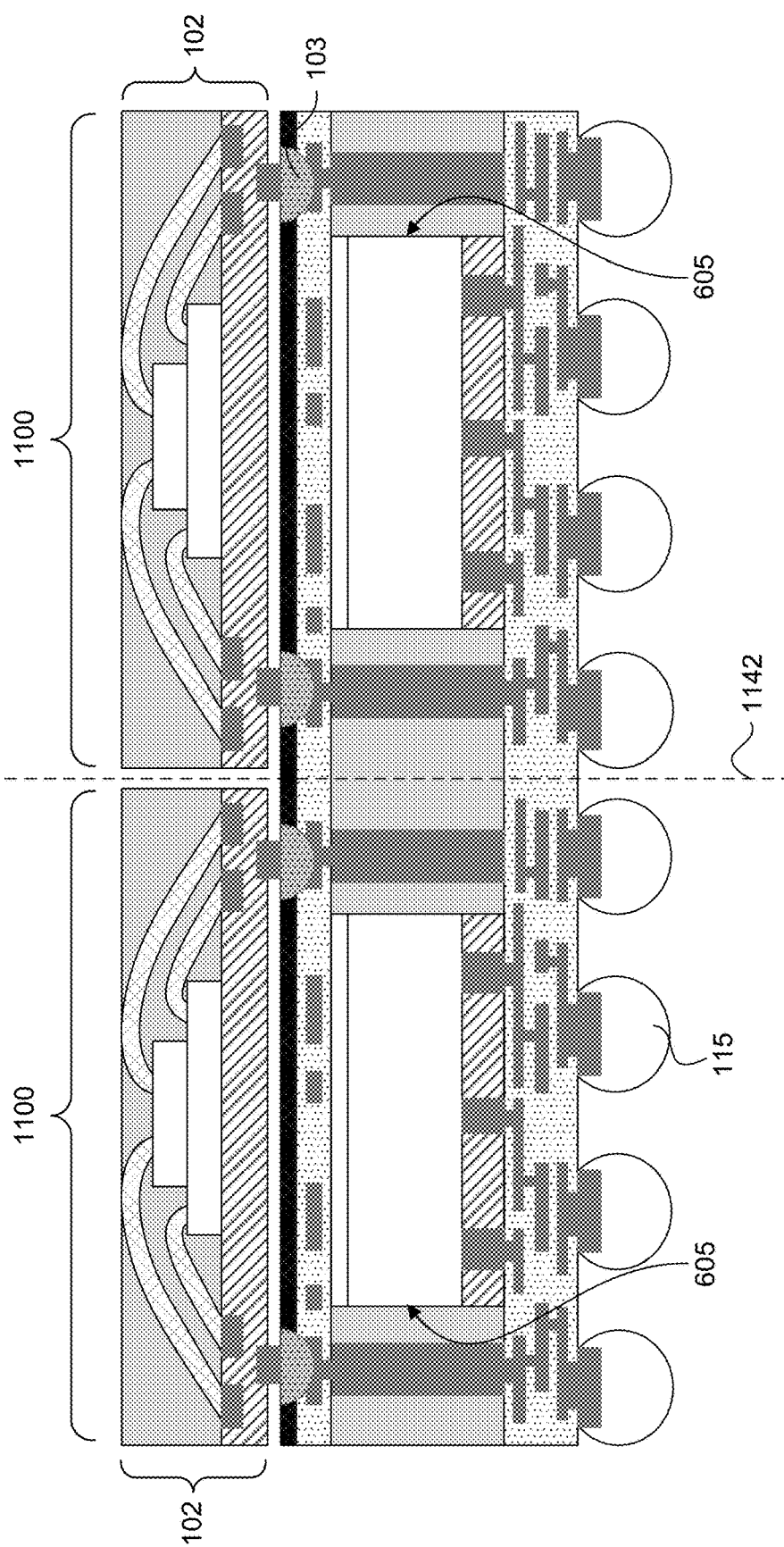

Referring back to FIG. 5, in operation 560, IC packages are bonded to the backside routing structure through the openings. For example, as shown in FIG. 11, IC packages 102 are bonded to the structure of FIG. 10 through openings 1040 and inter-package connectors 103. In some embodiments, inter-package connectors 103 may include solder paste, copper pillars, controlled collapse chip connection (C4) bumps, or suitable connectors.

The formation of the structure of FIG. 11 may be followed by a dicing process along line 1142 to form singulated IC packages 1100. In some embodiments, singulated IC packages 1100 may be similar to IC package 100 of FIG. 1. In some embodiments, a dicing saw or a laser cutting tool may be used in the dicing process.

Thus, the present disclosure describes various RDL structures in an IC package that are configured to provide improved structural reliability of RDL structures compared to other RDL structures in IC packages and consequently, to provide improved reliability of IC packages.

In an embodiment, an integrated circuit (IC) package includes an IC die and a routing structure. The IC die includes a conductive via, electrically coupled to the IC die, having a peripheral edge. The routing structure includes a conductive structure coupled to the conductive via. The conductive structure includes a cap region overlapping an area of the conductive via, a routing region having a first width, and an intermediate region having a second width along the peripheral edge of the conductive via. The intermediate region is arranged to couple the cap region to the routing region and the second width is greater than the first width.

In a further embodiment, an integrated circuit (IC) package includes a conductive via having a peripheral edge and a redistribution layer (RDL) structure, coupled to the conductive via. The RDL structure includes a cap region overlapping an area of the conductive via, a routing region having a first width, and an intermediate region having first and second tapered regions. The intermediate region is arranged to couple the cap region to the routing region. The first tapered region is positioned over the conductive via and the second tapered region is non-overlapping with the conductive via.

In a still further embodiment, a method of forming an integrated circuit (IC) package includes forming a singulated IC die having a conductive via, coupling the singulated IC die to a carrier substrate, and forming a redistribution layer (RDL) structure, coupled to the conductive via. The RDL structure includes a cap region overlapping an area of the conductive via, a routing region having a first width, and an intermediate region having a tapered region extending from a first area overlapping the conductive via to a second area external to the conductive via. The intermediate region is arranged to couple the cap region to the routing region. The tapered region includes a second width along the peripheral edge of the conductive via and the second width is greater than the first width.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the subjoined claims.

What is claimed is:

1. An integrated circuit (IC) package comprising:
an IC die having a conductive via, wherein the conductive via has a peripheral edge; and
a routing structure having a conductive structure, coupled to the conductive via, comprising:
a cap region overlapping an area of the conductive via;
a routing region having a first width from a top-down view; and
an intermediate region having a second width from the top-down view along the peripheral edge of the conductive via and arranged to couple the cap region to the routing region, the second width being greater than the first width.

2. The IC package of claim 1, wherein the routing region is non-overlapping with the conductive via.

3. The IC package of claim 1, further comprising: a through-via coupled to another conductive structure of the routing structure.

4. The IC package of claim 1, wherein the intermediate region comprises:
a first tapered region over the conductive via; and
a second tapered region non-overlapping with the conductive via.

5. The IC package of claim 1, wherein the intermediate region comprises a third width from the top-down view at a predetermined distance from the peripheral edge and towards the conductive via, the third width being greater than the first and second widths.

6. The IC package of claim 1, wherein the intermediate region comprises a third width from the top-down view at a predetermined distance from the peripheral edge and away from the conductive via, the third width being greater the first width and less than the second width.

7. The IC package of claim 1, wherein a width of the intermediate region within a predetermined distance from the peripheral edge is greater than the first width.

8. The IC package of claim 7, wherein the predetermined distance is in a range from about 8 μm to about 12 μm.

9. The IC package of claim 1, wherein the first width is in a range from about 1 μm to about 9 μm.

10. The IC package of claim 1, wherein the second width is in a range from about 10 μm to about 70 μm.

11. An integrated circuit (IC) package comprising:
a conductive via having a peripheral edge; and
a redistribution layer (RDL) structure, coupled to the conductive via, comprising:
a cap region overlapping an area of the conductive via;
a routing region having a first width from a top-down view; and
an intermediate region having first and second tapered regions and arranged to couple the cap region to the routing region, the first tapered region positioned over the conductive via and the second tapered region non-overlapping with the conductive via, wherein the intermediate region has a second width from the top-down view along the peripheral edge of the conductive via, the second width being greater than the first width.

12. The IC package of claim 11, further comprising:
an IC die having the conductive via; and
an insulating layer arranged to:
separate the RDL structure from the IC die; and
couple the RDL structure to the conductive via through another conductive via in the insulating layer.

13. The IC package of claim 11, wherein the first tapered region comprises a third width from the top-down view at a predetermined distance from the peripheral edge and towards the conductive via, the third width being greater than the first and the second widths.

14. The IC package of claim 11, wherein the second tapered region comprises a third width from the top-down view at a predetermined distance from the peripheral edge and away from the conductive via, the third width being greater than the first width and less than the second width.

15. The IC package of claim 11, wherein the routing region is non-overlapping with the conductive via.

16. An interconnect structure comprising:
a conductive via having a peripheral edge; and
a redistribution layer (RDL) structure, coupled to the conductive via, comprising:
a cap region overlapping the conductive via;
a routing region having a first width from a top-down view and non-overlapping with the conductive via; and
an intermediate region having a first tapered region and a second tapered region and arranged to couple the cap region to the routing region, the first tapered region overlapping with the conductive via and the second tapered region non-overlapping with the conductive via, wherein the intermediate region has a second width from the top-down view along the peripheral edge of the conductive via, the second width being greater than the first width.

17. The interconnect structure of claim 16, wherein the first tapered region comprises a third width from the top-down view at a predetermined distance from the peripheral edge and towards the conductive via, the third width being greater than the first and second widths.

18. The interconnect structure of claim 16, wherein the second tapered region comprises a third width from the top-down view at a predetermined distance from the peripheral edge and away from the conductive via, the third width being greater than the first width and less than the second width.

19. The interconnect structure of claim 18, wherein the predetermined distance ranges from about 8 μm to about 12 μm.

20. The interconnect structure of claim 16, wherein the second width ranges from about 10 μm to about 70 μm.

* * * * *